(12) United States Patent
Lv et al.

(10) Patent No.: US 9,551,907 B2
(45) Date of Patent: Jan. 24, 2017

(54) PIXEL UNIT AND ARRAY SUBSTRATE (71) Applicant: SHENZHEN CHINA STAR OPTOELECTRONICS TECHNOLOGY CO., LTD., Shenzhen, Guangdong (CN)

(72) Inventors: Qibiao Lv, Guangdong (CN); Xiaohui Yao, Guangdong (CN)

(73) Assignee: SHENZHEN CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 0 days.

(21) Appl. No.: 14/782,197

(22) PCT Filed: Jan. 20, 2015

(86) PCT No.: PCT/CN2015/071078
§ 371 (c)(1),
(2) Date: Feb. 1, 2016

(87) PCT Pub. No.: WO2015/109988
PCT Pub. Date: Jul. 30, 2015

(65) Prior Publication Data
US 2016/0320671 A1    Nov. 3, 2016

(30) Foreign Application Priority Data

Jan. 21, 2014 (CN) .......................... 2014 1 0028576

(51) Int. Cl.
*H01L 27/14* (2006.01)
*G02F 1/1343* (2006.01)
(Continued)

(52) U.S. Cl.
CPC ....... *G02F 1/134309* (2013.01); *G02F 1/1362* (2013.01); *G02F 1/1368* (2013.01);
(Continued)

(58) Field of Classification Search
CPC ............ H01L 27/1214; H01L 27/3248; H01L 27/3262
(Continued)

(56) References Cited

U.S. PATENT DOCUMENTS 8,045,083 B2 * 10/2011 Jung ..................... G02F 1/1368
349/48
2009/0310075 A1 * 12/2009 Kim .................. G02F 1/133707
349/144
(Continued)

FOREIGN PATENT DOCUMENTS

CN          1614485 A      5/2005
CN        101154001 A      4/2008
(Continued)

OTHER PUBLICATIONS

Wenjie Yao, the International Searching Authority written comments, Apr. 2015, CN.

*Primary Examiner* — Tan N Tran (57) ABSTRACT

The present invention discloses a pixel unit and an array substrate. The pixel unit comprises: a plurality of pixel electrodes, including oblique pixel electrodes extending obliquely and transverse pixel electrodes located on edges of the oblique pixel electrodes and extending transversely, the plurality of pixel electrodes forming a display region having an opening region; and, a conductive unit which is located within the opening region and partially overlapped with projections of the oblique pixel electrodes, one corner of the conductive unit close to the oblique pixel units being an unfilled corner or a round corner. Accordingly, the impact of an electric field around the opening region on the electric field of the oblique pixel electrodes is reduced, and the impact on the liquid crystal orientation of the opening region (Continued)

is reduced; the dark fringe of pixels is improved; the aperture ratio of pixels is increased; and the quality of display is improved.

9 Claims, 4 Drawing Sheets

(51) Int. Cl.
| | | |
|---|---|---|
| *G02F 1/1362* | (2006.01) | |
| *G02F 1/1345* | (2006.01) | |
| *G02F 1/1368* | (2006.01) | |
| *H01L 27/12* | (2006.01) | |
| *G02F 1/1333* | (2006.01) | |

(52) U.S. Cl.
CPC ...... *G02F 1/13439* (2013.01); *G02F 1/13458* (2013.01); *G02F 1/134363* (2013.01); *G02F 1/136286* (2013.01); *H01L 27/1214* (2013.01); *G02F 2001/133302* (2013.01); *G02F 2201/121* (2013.01); *G02F 2201/123* (2013.01)

(58) Field of Classification Search
USPC .......................................... 257/59, 72, 258
See application file for complete search history.

(56) References Cited

U.S. PATENT DOCUMENTS

| | | | |
|---|---|---|---|
| 2010/0188629 A1* | 7/2010 | Nakata | ............... G02F 1/1303 349/125 |
| 2011/0157537 A1 | 6/2011 | Chen et al. | |
| 2012/0218501 A1 | 8/2012 | Lee et al. | |
| 2014/0184973 A1* | 7/2014 | Kim | ............... G02F 1/136209 349/43 |

FOREIGN PATENT DOCUMENTS

| | | |
|---|---|---|
| CN | 101546073 A | 9/2009 |
| CN | 102759826 A | 10/2012 |
| CN | 103257489 A | 8/2013 |
| CN | 103278974 A | 9/2013 |
| CN | 103760723 A | 4/2014 |

* cited by examiner

PIXEL UNIT AND ARRAY SUBSTRATE

FIELD OF THE INVENTION

The present invention relates to the technical field of liquid crystal display, in particular to a pixel unit and an array substrate having the pixel unit.

BACKGROUND OF THE INVENTION

The Thin Film Transistor Liquid Crystal Display (TFT-LCD) technology, as a mainstream display manufacturing technology at present, has been widely applied. With the continuous improvement of the manufacturing technology, the resolution of liquid crystal displays becomes higher and higher, from high definition (1366×768) very popular in the past to full high definition (1920×1080), to 4K2K (3840×2160) TV sets currently popular with consumers and even 8K4K (7680×4320) TV sets to be launched in the future.

The improvement of the resolution of liquid crystal displays implies that the pixel unit becomes smaller and smaller, the difficulty in design and manufacture becomes lager and larger and the distance between various wirings also becomes smaller and smaller. Consequently, various problems, one of which is the dark fringe of pixels, are caused.

Figure 1:
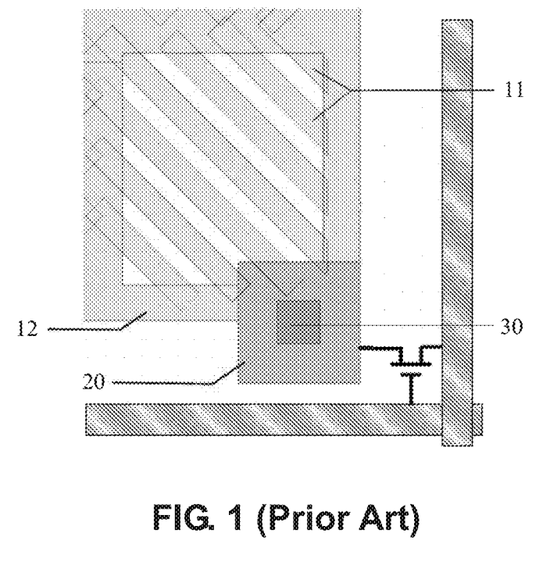
FIG. 1 is a structural diagram of a main region of a pixel unit in the prior art.
Figure 1A:
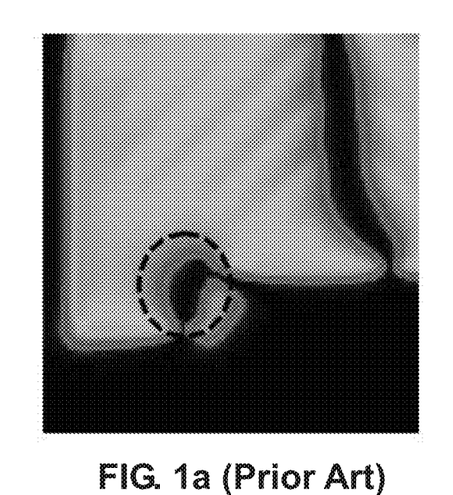
FIG. 1a is a simulated effect diagram of the penetration rate of the pixel unit in FIG. 1.

The dark fringe of pixels refers that an opening region in a pixel unit close to a via hole is non-transmittable to light normally during the normal display of a liquid crystal panel. As shown in FIG. 1, a structural diagram a main region of a pixel unit in the prior art is shown. The pixel unit includes a plurality of electrodes and a pad 20. The pixel electrodes include a plurality of oblique pixel electrodes 11 extending obliquely and transverse pixel electrodes 12 extending transversely. The pad 20 is covered on a via hole 30. An opening region is formed on the pixel electrodes at a position close to the via hole 30. As the pixel unit is small, the pad 20 accesses to the opening region and is partially overlapped with projections of the oblique pixel electrodes 11, so that the pad 20, the transverse pixel electrodes 12 or other conductive components cause an interference to the electric field of the oblique pixel electrodes 11. As shown in FIG. 1a, a simulated effect diagram of the penetration rate of the main region of the pixel unit simulated by Expert LCD software is shown, where grey white indicates that it is light-transmittable while black indicates that it is not light-transmittable, and there is dark fringe in the opening region marked by a circle.

Figure 2:
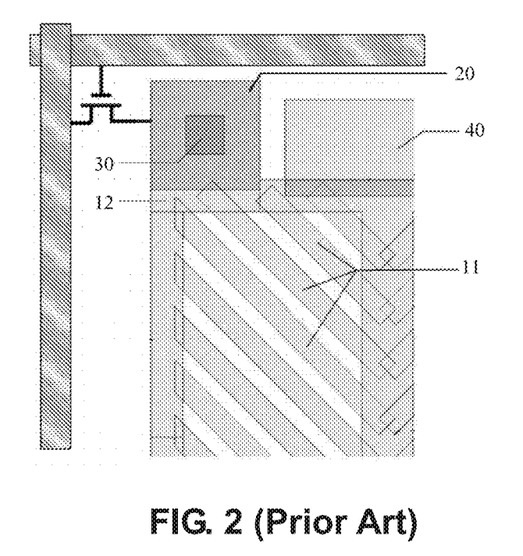
FIG. 2 is a structural diagram of a sub region of a pixel unit in the prior art.
Figure 2A:
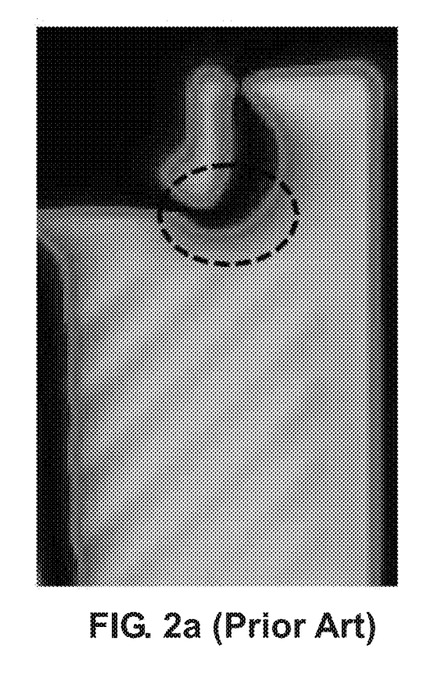
FIG. 2a is a simulated effect diagram of the penetration rate of the pixel unit in FIG. 2.

As shown in FIG. 2, a structural diagram of a sub region of a pixel unit in the prior art is shown, where a common electrode 40 of the pixel unit accesses to the opening region, and the common electrode 40 is partially overlapped with projections of oblique pixel electrodes 11, so that the common electrode 40, the transverse pixel electrodes 12 or other conductive components cause an interference to the electric field of the oblique pixel electrodes 11. As shown in FIG. 2a, a simulated effect diagram of the penetration rate of the sub region of the pixel unit simulated by Expert LCD software is shown, where grey white indicates that it is light-transmittable while black indicates that it is not light-transmittable, and there is dark fringe in the opening region marked by a circle.

Therefore, an electric field around the opening region of the pixel electrode in the prior art will have an impact on the electric field of oblique pixel electrodes, there resulting dark fringe in the opening region. The occurrence of the dark fringe will directly decrease the aperture ratio of pixels and the penetration rate of a panel, and may additionally cause uneven display brightness problems, thereby degrading the quality of display.

SUMMARY OF THE INVENTION

A main object of the present invention is to provide a pixel unit and an array substrate in order to reduce the impact on the electric field of oblique pixel electrodes and improve the quality of display.

To achieve the above object, the present invention provides a general invention concept. That is, the impact of an electric field around the opening region on the electric field of the oblique pixel electrodes is reduced by reducing the area of conductive components of non-oblique pixel electrodes located within an opening region of the pixel unit, so that the impact on the liquid crystal orientation of the opening region is reduced, the dark fringe of pixels is improved, the aperture ratio of pixels is increased, and the quality of display is improved. The conductive components may be a conductive unit located within the opening region and partially overlapped with the projections of oblique pixel electrodes, or transverse pixel electrodes located on edges of the oblique pixel electrodes and extending transversely.

Accordingly, the present invention provides a pixel unit, including:

a plurality of pixel electrodes, including oblique pixel electrodes extending obliquely and transverse pixel electrodes located on edges of the oblique pixel electrodes and extending transversely, the plurality of pixel electrodes forming a display region having an opening region, a portion of the transverse pixel electrodes located within the opening region having a gap on one side close to the oblique pixel electrodes; and a conductive unit, which is located within the opening region and partially overlapped with the projections of the oblique pixel electrodes, one corner of the conductive unit close to the oblique pixel units being an unfilled corner or a round corner.

According to the same invention concept, the present invention further provides a pixel unit, including:

a plurality of pixel electrodes, including oblique pixel electrodes extending obliquely and transverse pixel electrodes located on edges of the oblique pixel electrodes and extending transversely, the plurality of pixel electrodes forming a display region having an opening region; and a conductive unit, which is located within the opening region and partially overlapped with the projections of the oblique pixel electrodes, one corner of the conductive unit close to the oblique pixel units being an unfilled corner or a round corner.

Preferably, the conductive unit is a pad or a common electrode. Within a main region of a pixel unit, when the pad is located within the opening region and partially overlapped with the projections of the oblique pixel electrodes, the pad is the conductive unit; while within a sub region of the pixel unit, when the common electrode is located within the opening region and partially overlapped with the projections of the oblique pixel electrodes, the common electrode is the conductive unit.

Preferably, the conductive unit is a pad; the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

Preferably, the conductive unit is a common electrode; the pixel unit further comprises a pad close to the opening region; the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

Preferably, a portion of the transverse pixel electrodes located within the opening region has a gap on one side close to the oblique pixel electrodes.

According to the same invention concept, the present invention further provides another pixel unit, including a plurality of pixel electrodes including oblique pixel electrodes extending obliquely and transverse pixel electrodes located on edges of the oblique pixel electrodes and extending transversely, the plurality of pixel electrodes forming a display region having an opening region, wherein a portion of the transverse pixel electrodes located within the opening region has a gap on one side close to the oblique pixel electrodes.

Preferably, the pixel unit further includes a pad which is located within the opening region and partially overlapped the projections of the oblique pixel electrodes, one corner of the pad close to the oblique pixel units being an unfilled corner or a round corner.

Preferably, the pixel unit further includes a common electrode located within the opening region and a pad close to the opening region, the common electrode being partially overlapped with the projections of the oblique pixel electrodes, one corner of the common electrode close to the oblique pixel electrodes being an unfilled corner or a round corner.

Preferably, the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

Meanwhile, the present invention provides an array substrate, including a glass substrate and a pixel unit disposed on the glass substrate, wherein:

the pixel unit includes a plurality of pixel electrodes, including oblique pixel electrodes extending obliquely and transverse pixel electrodes located on edges of the oblique pixel electrodes and extending transversely, the plurality of pixel electrodes forming a display region having an opening region; and, a conductive unit, which is located within the opening region and partially overlapped with projections of the oblique pixel electrodes, one corner of the conductive unit close to the oblique pixel units being an unfilled corner or a round corner.

According to the same invention concept, the present invention further provides an array substrate, including a glass substrate and a pixel unit disposed on the glass substrate, wherein the pixel unit includes a plurality of pixel electrodes including oblique pixel electrodes extending obliquely and transverse pixel electrodes located on edges of the oblique pixel electrodes and extending transversely, the plurality of pixel electrodes forming a display region having an opening region, a portion of the transverse pixel electrodes located within the opening region having a gap on one side close to the oblique pixel electrodes.

In the pixel unit provided by the present invention, by reducing the area of conductive components of non-oblique pixel electrodes located within an opening region of the pixel unit, the impact of an electric field around the opening region on the electric field of the oblique pixel electrodes is reduced. Specifically, for a main region of the pixel unit, the impact on the electric field of the electrodes is reduced by reducing the area of a pad or/and transverse pixel electrodes; while for a sub region of the pixel unit, the impact on the electric field of the electrodes is reduced by reducing the area of a common electrode or/and transverse pixel electrodes. Accordingly, the impact on the liquid crystal orientation of the opening region is reduced, the dark fringe of pixels is improved, the aperture ratio of pixels is increased, and the quality of display is improved.

The implementations, functional characteristics and advantages of the object of the present invention will be further described below with reference to the drawings by embodiments.

DETAILED DESCRIPTION OF THE PREFERRED EMBODIMENTS

It should be understood that the specific embodiments described herein are merely for explaining the present invention and not intended to limit the present invention.

The general invention concept is that the impact of an electric field around an opening region on the electric field of oblique pixel electrodes is reduced by reducing the area of conductive components of non-oblique pixel electrodes located within the opening region of the pixel unit, wherein the conductive components include transverse pixel electrodes located on edges of the oblique pixel electrodes and extending transversely or/and a conductive unit located within the opening region and partially overlapped with the projections of oblique pixel electrodes. For a conductive unit, within a main region of the pixel unit, the conductive unit is a pad located within the opening region and partially overlapped with the projections of the oblique pixel electrodes; while within a sub region of the pixel unit, the conductive unit is a common electrode located within the opening region and partially overlapped with the projections of the oblique pixel electrodes. The detailed description will be given as below with reference to the drawings.

Figure 3:
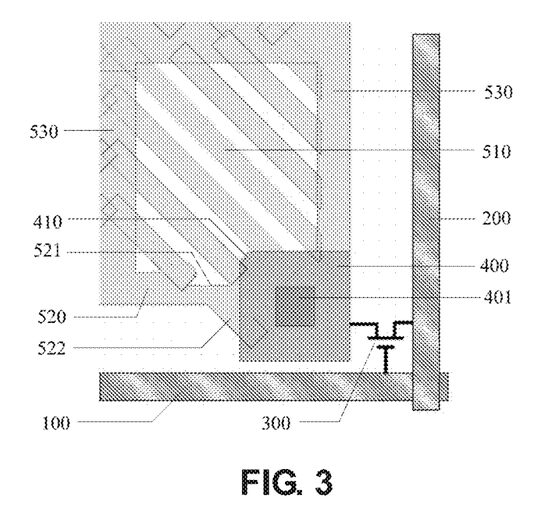
FIG. 3 is a structural diagram of a main region of an embodiment of a pixel unit according to the present invention.

Referring to FIG. 3, a structural diagram of a main region of a pixel unit according to the present invention is shown. The pixel unit includes a gate line 100, a source line 200, a thin film transistor 300, a pad 400, an insulating layer (not shown) and a plurality of pixel electrodes.

The gate line 100 is intersected with, preferably vertical to, the source line 200. The gate line 100 extends transversely, while the source line 200 extends longitudinally. The pad 400 is formed at the intersection of the gate line 100 and the source line 200 and electrically connected to the gate line 100 and the source line 200, respectively. The pad 400 may be rectangular, trapezoidal, rhombic or polygonal. The thin film transistor 300 is also located at the intersection of the gate line 100 and the source line 200; furthermore, the gate of the thin film transistor 300 is electrically connected to the gate line 100, the source thereof is electrically connected to the source line 200, while the drain thereof is electrically connected to the pad 400. The insulating layer covers the gate line 100 and the source line 200 and covers the pad 400. A via hole 401 is formed on the insulating layer at a position corresponding to the pad 400.

The pixel electrodes are made of transparent conductive material preferably indium tin oxide (ITO), and electrically connected to the pad 400 through the via hole 401. The pixel electrodes include oblique pixel electrodes 510 extending obliquely, transverse pixel electrodes 520 extending transversely and longitudinal pixel electrodes 530 extending longitudinally. A plurality of oblique pixel electrodes 510, which are parallel to and spaced apart from each other, is provided. The pixel electrodes form a display region. An opening region is formed on one end of the display region close to the via hole 401. Due to the small pixel unit and the limited space, the pad 400 is thus located within the opening region and partially overlapped with the projections of the oblique pixel electrodes 510.

To reduce the impact of an electric field around the opening region on the electric field of the oblique pixel electrodes 510, the following improvements are made to the pixel unit in this embodiment.

First, to reduce the impact of the electric field of the pad 400 on the electric field of the oblique pixel electrodes 510, in this embodiment, one corner of the pad 400 close to the oblique pixel electrodes 510 is cut off to form an unfilled corner 410, so that, on one hand, the area of the pad 400 is reduced and the impact of the pad 400 on the oblique pixel electrodes 510 is greatly reduced. Particularly for a rectangular pad 400, after the straight corner within the opening region is cut off, the impact of the electric field of the straight corner portion on the electric field of the oblique pixel electrodes 510 may be effectively eliminated so that the dark fringe of the opening region is effectively inhibited and the quality of display is improved. In some embodiments, the above effects may be achieved by changing one corner of the pad 400 close to the oblique pixel electrodes 510 to a round corner.

Further, a gap 521 is dug on one side of a portion of the transverse pixel electrodes 520 located within the opening region close to the oblique pixel electrodes 510, so that the width of this portion of the transverse pixel electrodes 520 is less than the width of the remaining portion, preferably, a half of the width of the remaining portion. Accordingly, the area of the transverse pixel electrodes 520 is reduced, the impact of the transverse pixel electrodes 520 on the electric field of the oblique pixel electrodes 510 is reduced, the dark fringe of the opening region is further improved, and the quality of display is enhanced.

Further, the transverse pixel electrodes 520 are also partially overlapped with the projection of the pad 400, and a leg 522 is obliquely extended from the transverse pixel electrodes 520 at a joint of projections of the two in a direction away from the opening region. The leg 522 is parallel to the oblique pixel electrodes 510. The direction of the electric field of the leg 522 of the transverse pixel electrodes 520 is the same as that of the oblique pixel electrodes 510, so the impact of the transverse pixel electrodes 520 on the electric field of the oblique pixel electrodes 510 is effectively reduced and the dark fringe is improved.

Figure 3A:
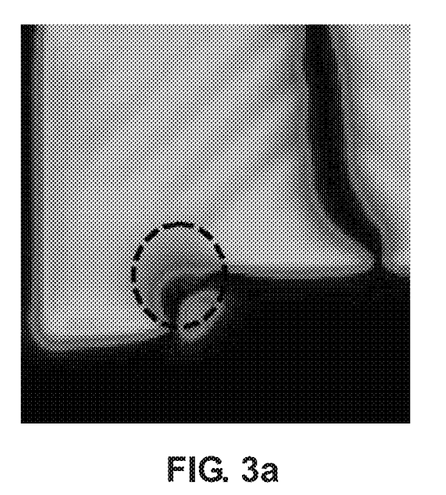
FIG. 3a is a simulated effect diagram of the penetration rate of the pixel unit in FIG. 3.

Referring to FIG. 1a and FIG. 3a, effect diagrams obtained by simulating the penetration rate of a pixel unit by Expert LCD software are shown, where FIG. 1a is the effect diagram of the prior art while FIG. 3a is the effect diagram of the present invention after the main region of the pixel unit is improved. In the figures, grey white indicates that it is light-transmittable, while black indicates that it is not light-transmittable. As marked by a circle, it can be seen by comparing the results of simulation before and after improvement that the dark fringe near the opening region (or a via hole region) of the main region of the pixel unit is well improved.

The inventive object, i.e., reducing the impact of the electric field around the opening region on the electric field of the oblique pixel electrodes 510 and thus improving the quality of display, of the present invention may be realized by implementing any one or a combination of any two of the above three improvement solutions of the pixel units or simultaneously implementing the three improvement solutions.

Figure 4:
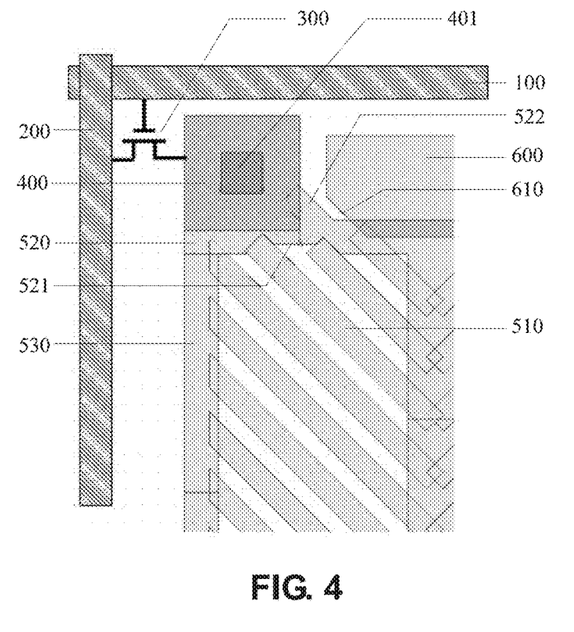
FIG. 4 is a structural diagram of a sub region of an embodiment of a pixel unit according to the present invention.

Referring to FIG. 4, a structural diagram of a sub region of a pixel unit according to the present invention is shown. The pixel unit includes a gate line 100, a source line 200, a thin film transistor 300, a pad 400, a common electrode, an insulating layer (not shown) and a plurality of pixel electrodes.

The gate line 100 is intersected with, preferably vertical to, the source line. That is, the gate line 100 extends transversely, while the source line 200 extends longitudinally. The pad 400 is formed at the intersection of the gate line 100 and the source line 200 and electrically connected to the gate line 100 and the source line 200, respectively. The pad 400 may be rectangular, trapezoidal, rhombic or polygonal. The thin film transistor 300 is also located at the intersection of the gate line 100 and the source line 200. The gate of the thin film transistor 300 is electrically connected to the gate line 100, the source thereof is electrically connected to the source line 200, while the drain thereof is electrically connected to the pad 400. The insulating layer covers the gate line 100 and the source line 200 and covers the pad 400. A via hole 401 is formed on the insulating layer at a position corresponding to the pad 400.

The pixel electrodes are made of transparent conductive material preferably indium tin oxide (ITO), and electrically connected to the pad 400 through the via hole 401. The pixel electrodes include oblique pixel electrodes 510 extending obliquely, transverse pixel electrodes 520 extending transversely and longitudinal pixel electrodes 530 extending longitudinally. A plurality of oblique pixel electrodes 510, which are parallel to and spaced apart from each other, is provided. The plurality of pixel electrodes form a display region. An opening region is formed on one end of the display region close to the via hole 401. The pad 400 is close to the opening region, but not overlapped with the projections of the oblique pixel electrodes 510. The common electrode 600 is located within the opening region, and due to a large area thereof, partially overlapped with the projections of the oblique pixel electrodes 510.

To reduce the impact of an electric field around the opening region on the electric field of the oblique pixel electrodes 510, the following improvements are made to the pixel unit in this embodiment.

First, to reduce the impact of the electric field of the common electrode 600 on the electric field of the oblique pixel electrodes 510, in this embodiment, one corner of the common electrode 600 close to the oblique pixel electrodes 510 is cut off to form an unfilled corner, so that the area of the common electrode 600 is reduced, and the impact of the common electrode 600 on the oblique pixel electrodes 510 is greatly reduced. Particularly, after a straight corner of the common electrode 600 within the opening region is cut off, the impact of the electric field of the straight corner portion on the electric field of the oblique pixel electrodes 510 may be effectively eliminated so that the dark fringe of the opening region is effectively inhibited and the quality of display is improved. In some embodiments, the above effects may be achieved by changing one corner of the common electrode 600 close to the oblique pixel electrodes 510 to a round corner.

Further, a gap 521 is dug on one side of a portion of the transverse pixel electrodes 520 located within the opening region (particularly a portion close to the pad 400) close to the oblique pixel electrodes 510, so that the width of this portion of the transverse pixel electrodes 520 is less than the width of the remaining portion, preferably, a half of the width of the remaining portion. Accordingly, the area of the transverse pixel electrodes 520 is reduced, the impact of the transverse pixel electrodes 520 on the electric field of the oblique pixel electrodes 510 is reduced, the dark fringe of the opening region is further improved, and the quality of display is enhanced.

Further, the transverse pixel electrodes 520 are also partially overlapped with the projection of the pad 400, and a leg 522 is obliquely extended from the transverse pixel electrodes 520 at a joint of projections of the two in a direction away from the opening region. The leg 522 is parallel to the oblique pixel electrodes 510. The direction of the electric field of the leg 522 of the transverse pixel electrodes 520 is the same as that of the oblique pixel electrodes 510, so the impact of the transverse pixel electrodes 520 on the electric field of the oblique pixel electrodes 510 is effectively reduced and the dark fringe is improved.

Figure 4A:
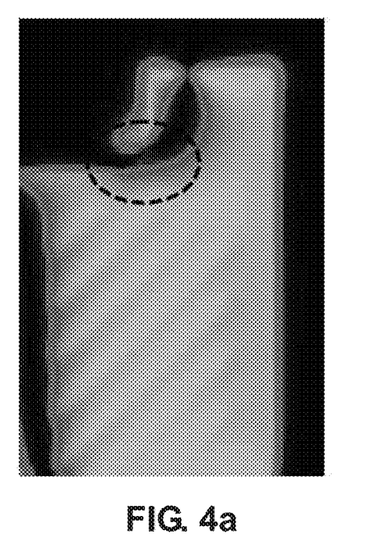
FIG. 4a is a simulated effect diagram of the penetration rate of the pixel unit in FIG. 4.

Referring to FIG. 2a and FIG. 4a together, simulated effect diagrams obtained by simulating the penetration rate of a pixel unit by Expert LCD software are shown, where FIG. 2a is the effect diagram of the prior art while FIG. 4a is the effect diagram of the present invention after the sub region of the pixel unit is improved. In the figures, grey white indicates that it is light-transmittable, while black indicates that it is not light-transmittable. As marked by a circle, it can be seen by comparing the results of simulation before and after improvement that the dark fringe near the opening region (or a via hole region) of the main region of the pixel unit is well improved.

The inventive object, i.e., reducing the impact of the electric field around the opening region on the electric field of the oblique pixel electrodes 510 and thus improving the quality of display, of the present invention may be realized by implementing any one or a combination of any two of the above three improvement solutions of the pixel units or simultaneously implementing the three improvement solutions.

Hereby, in the pixel unit provided by the present invention, by reducing the area of conductive components of non-oblique pixel electrodes 510 located within the opening region of the pixel unit, the impact of an electric field around of the opening region on the electric field of the oblique pixel electrodes 510 is reduced. Specifically, for a main region of the pixel unit, the impact on the electric field of the electrodes is reduced by reducing the area of the pad 400 or/and transverse pixel electrodes 520; while for a sub region of the pixel unit, the impact on the electric field of the electrodes is reduced by reducing the area of the common electrode 600 or/and transverse pixel electrodes 520. Accordingly, the impact on the liquid crystal orientation of the opening region is reduced, the dark fringe of pixels is improved, the aperture ratio of pixels is increased, and the quality of display is improved.

Meanwhile, the present invention provides an array substrate, including a glass substrate and a pixel unit. The array substrate is disposed on the glass substrate. The pixel unit includes a pad, a common electrode and a plurality of pixel electrodes. The plurality of pixel electrodes include oblique pixel electrodes extending obliquely and transverse pixel electrodes located on edges of the oblique pixel electrodes and extending transversely. The plurality of pixel electrodes form a display region having an opening region. A portion of the transverse pixel electrodes located within the opening region has a gap on one side close to the oblique pixel electrodes. The pad or common electrode is located within the opening region and partially overlapped with projections of the oblique pixel electrodes, and one corner of the pad or common electrode close to the oblique pixel electrodes is an unfilled corner or a round corner. The pixel unit described in this embodiment is the pixel unit involved in the above embodiments of the present invention, and will not be repeated here.

In the array substrate provided by the present invention, by reducing the area of conductive components of non-oblique pixel electrodes located within the opening region of the pixel unit, the impact of an electric field around of the opening region on the electric field of the oblique pixel electrodes is reduced. Specifically, for a main region of the pixel unit, the impact on the electric field of the electrodes is reduced by reducing the area of the pad or/and transverse pixel electrodes; while for a sub region of the pixel unit, the impact on the electric field of the electrodes is reduced by reducing the area of the common electrode or/and transverse pixel electrodes. Accordingly, the impact on the liquid crystal orientation of the opening region is reduced, the dark fringe of pixels is improved, the aperture ratio of pixels is increased, and the quality of display is improved.

It should be understood that the foregoing description merely shows preferred embodiments of the present invention and is not intended to limit the patent scope of the present invention. Any equivalent structures or equivalent flow transformations, made by utilizing the content of the description and drawings of the present invention and directly or indirectly applied in other related technical fields, shall fall into the patent protection scope of the present invention.

What is claimed is:

1. A pixel unit, comprising:
  a plurality of pixel electrodes, including oblique pixel electrodes extending obliquely and transverse pixel electrodes located on edges of the oblique pixel electrodes and extending transversely, the plurality of pixel electrodes forming a display region having an opening region; and
  a pad, which is located within the opening region and partially overlapped with the projections of the oblique pixel electrodes, one corner of the conductive unit close to the oblique pixel electrodes being an unfilled corner or a round corner; and wherein the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

2. The pixel unit according to claim 1, wherein a portion of the transverse pixel electrodes located within the opening region has a gap on one side close to the oblique pixel electrodes.

3. The pixel unit according to claim 1, wherein the pixel unit further comprises a common electrode located within the opening region and the pad close to the opening region, the common electrode being partially overlapped with the projections of the oblique pixel electrodes, one corner of the common electrode close to the oblique pixel electrodes being an unfilled corner or a round corner.

4. A pixel unit, comprising a plurality of pixel electrodes including oblique pixel electrodes extending obliquely and transverse pixel electrodes located on edges of the oblique pixel electrodes and extending transversely, the plurality of pixel electrodes forming a display region having an opening region, wherein a portion of the transverse pixel electrodes located within the opening region has a gap on one side close to the oblique pixel electrodes; and a pad, wherein the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

5. The pixel unit according to claim 4, wherein the pixel unit further comprises a pad which is located within the opening region and partially overlapped the projections of the oblique pixel electrodes, one corner of the pad close to the oblique pixel electrodes being an unfilled corner or a round corner.

6. The pixel unit according to claim 4, wherein the pixel unit further comprises a common electrode located within the opening region and the pad close to the opening region, the common electrode being partially overlapped with the projections of the oblique pixel electrodes, one corner of the common electrode close to the oblique pixel electrodes being an unfilled corner or a round corner.

7. An array substrate, comprising a glass substrate and a pixel unit disposed on the glass substrate, the pixel unit comprising:

a plurality of pixel electrodes, including oblique pixel electrodes extending obliquely and transverse pixel electrodes located on edges of the oblique pixel electrodes and extending transversely, the plurality of pixel electrodes forming a display region having an opening region; and a pad, which is located within the opening region and partially overlapped with projections of the oblique pixel electrodes, one corner of the conductive unit close to the oblique pixel electrodes being an unfilled corner or a round corner; and wherein the transverse pixel electrodes are partially overlapped with a projection of the pad; and a leg is obliquely extended from the transverse pixel electrodes at a joint of projections of the two in a direction away from the opening region, the leg being parallel to the oblique pixel electrode.

8. The array substrate according claim 7, wherein a portion of the transverse pixel electrodes located within the opening region has a gap on one side close to the oblique pixel electrodes.

9. The array substrate according claim 7, wherein the pixel unit further comprises a common electrode located within the opening region and the pad close to the opening region, the common electrode being partially overlapped with the projections of the oblique pixel electrodes, one corner of the common electrode close to the oblique pixel electrodes being an unfilled corner or a round corner.

* * * * *